(12) United States Patent
Furuhashi (10) Patent No.: US 11,107,987 B2
(45) Date of Patent: Aug. 31, 2021

(54) SEMICONDUCTOR STORAGE DEVICE

(71) Applicant: TOSHIBA MEMORY CORPORATION, Tokyo (JP)

(72) Inventor: Hironobu Furuhashi, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/551,259

(22) Filed: Aug. 26, 2019

(65) Prior Publication Data

US 2020/0274063 A1    Aug. 27, 2020

(30) Foreign Application Priority Data

Feb. 22, 2019  (JP) .............................. JP2019-030962

(51) Int. Cl.
  *H01L 27/24* (2006.01)
  *H01L 45/00* (2006.01)
  *G11C 13/00* (2006.01)

(52) U.S. Cl.
  CPC .......... *H01L 45/144* (2013.01); *G11C 13/004* (2013.01); *G11C 13/0004* (2013.01); *G11C 13/0069* (2013.01); *H01L 27/2409* (2013.01); *H01L 27/2481* (2013.01); *H01L 27/2436* (2013.01); *H01L 45/06* (2013.01); *H01L 45/1233* (2013.01)

(58) Field of Classification Search
  None
  See application file for complete search history.

(56) References Cited

U.S. PATENT DOCUMENTS

| | | | |
|---|---|---|---|
| 8,232,542 B2* | 7/2012 | Sousa | ................ H01L 45/1233 |
| | | | 257/2 |
| 8,946,666 B2 | 2/2015 | Cheng | |
| 8,964,442 B2 | 2/2015 | Lung | |
| 9,525,132 B1* | 12/2016 | Su | ........................ H01L 45/126 |
| 9,793,323 B1 | 10/2017 | Lung | |
| 2005/0226036 A1 | 10/2005 | Aratani | |
| 2007/0158634 A1 | 7/2007 | Ooishi | |

(Continued)

FOREIGN PATENT DOCUMENTS

| | | |
|---|---|---|
| JP | 2011-018838 A | 1/2011 |
| JP | 2011-066337 A | 3/2011 |

(Continued)

*Primary Examiner* — William A Harriston
(74) *Attorney, Agent, or Firm* — Foley & Lardner LLP (57) ABSTRACT

A semiconductor storage device includes a first conductive layer, a second conductive layer, and a first chalcogen layer provided therebetween. A third conductive layer and a fourth conductive layer have a second chalcogen layer provided therebetween. The second chalcogen layer contains tellurium (Te). When a minimum value and a maximum value of a composition ratio of tellurium in the second chalcogen layer observed along the first direction are a first minimum value and a first maximum value, respectively, the first minimum value is observed at a position closer to the third conductive layer than a center position in the first direction of the second chalcogen layer, and the first maximum value is observed at a position closer to the fourth conductive layer than the center position in the first direction of the second chalcogen layer.

19 Claims, 6 Drawing Sheets

(56) References Cited

U.S. PATENT DOCUMENTS

| | | | |
|---|---|---|---|
| 2007/0159868 A1* | 7/2007 | Sugita | G11C 13/0033 |
| | | | 365/100 |
| 2008/0042119 A1 | 2/2008 | Sandoval et al. | |
| 2008/0128677 A1* | 6/2008 | Park | H01L 45/1233 |
| | | | 257/4 |
| 2010/0072451 A1 | 3/2010 | Terao et al. | |
| 2010/0163836 A1* | 7/2010 | Shepard | H01L 45/1691 |
| | | | 257/5 |
| 2011/0069531 A1 | 3/2011 | Aburada | |
| 2014/0185359 A1* | 7/2014 | Furuhashi | H01L 45/144 |
| | | | 365/148 |
| 2016/0233421 A1* | 8/2016 | Suzuki | H01L 27/2463 |
| 2016/0268500 A1* | 9/2016 | Furuhashi | H01L 27/228 |
| 2016/0268503 A1* | 9/2016 | Suzuki | H01L 45/144 |
| 2017/0117328 A1 | 4/2017 | Terai | |
| 2017/0244026 A1* | 8/2017 | Wu | H01L 45/126 |
| 2018/0033962 A1* | 2/2018 | Redaelli | H01L 45/1608 |
| 2020/0274063 A1* | 8/2020 | Furuhashi | G11C 13/0069 |
| 2020/0294585 A1* | 9/2020 | Nakazawa | H01L 27/224 |
| 2020/0303455 A1* | 9/2020 | Nakayama | H01F 10/3254 |

FOREIGN PATENT DOCUMENTS

| | | |
|---|---|---|
| JP | 2011-211226 A | 10/2011 |
| JP | 2017-085103 A | 5/2017 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2019-030962, filed Feb. 22, 2019, the entire contents of which are incorporated herein by reference.

FIELD

Embodiments described herein relate generally to a semiconductor storage device.

BACKGROUND

A semiconductor storage device is known, which includes a first conductive layer, a second conductive layer separated from the first conductive layer in a first direction, a chalcogen layer provided between the first conductive layer and the second conductive layer, and a peripheral circuit connected to the first conductive layer and the second conductive layer. The chalcogen layer contains germanium (Ge), antimony (Sb), tellurium (Te), and the like.

Examples of related art include JP-A-2011-18838.

DETAILED DESCRIPTION

At least one embodiment provides a semiconductor storage device that is easily miniaturized.

In general, according to at least one embodiment, a semiconductor storage device includes a first conductive layer, a second conductive layer separated from the first conductive layer in a first direction, and a first chalcogen layer provided between the first conductive layer and the second conductive layer. The semiconductor storage device further includes a third conductive layer, a fourth conductive layer separated from the third conductive layer in the first direction, and a second chalcogen layer provided between the third conductive layer and the fourth conductive layer. Further, the semiconductor storage device includes a peripheral circuit connected to the first conductive layer and the second conductive layer. The third conductive layer and the fourth conductive layer are not connected to the peripheral circuit. The second chalcogen layer contains tellurium (Te). When a minimum value and a maximum value of a composition ratio of tellurium in the second chalcogen layer observed along the first direction are a first minimum value and a first maximum value, the first minimum value is observed at a position closer to the third conductive layer than a center position in the first direction of the second chalcogen layer, and the first maximum value is observed at a position closer to the fourth conductive layer than the center position in the first direction of the second chalcogen layer.

According to at least one embodiment, a semiconductor storage device includes a first conductive layer, a second conductive layer separated from the first conductive layer in a first direction, and a first chalcogen layer provided between the first conductive layer and the second conductive layer. The semiconductor storage device further includes a third conductive layer, a fourth conductive layer separated from the third conductive layer in the first direction, and a second chalcogen layer provided between the third conductive layer and the fourth conductive layer. Further, the semiconductor storage device includes a peripheral circuit connected to the first conductive layer and the second conductive layer. The third conductive layer and the fourth conductive layer are not connected to the peripheral circuit. The second chalcogen layer contains antimony (Sb). When a minimum value and a maximum value of a composition ratio of antimony in the second chalcogen layer observed along the first direction is a third minimum value and a third maximum value, the third minimum value is observed at a position closer to the fourth conductive layer than a center position in the first direction of the second chalcogen layer, and the third maximum value is observed at a position closer to the third conductive layer than the center position in the first direction of the second chalcogen layer.

Next, a semiconductor storage device according to at least one embodiment will be described in detail with reference to the drawings. The following embodiments are merely examples, and are not shown for the purpose of limiting the present disclosure.

Also, in the present specification, a predetermined direction parallel to a surface of a substrate is referred to as an X direction, a direction parallel to the surface of the substrate and perpendicular to the X direction is referred to as a Y direction, and a direction perpendicular to the surface of the substrate is referred to as a Z direction.

Further, in the present specification, a direction along a predetermined plane is referred to as a first direction, a direction intersecting the first direction and along the predetermined plane is referred to as a second direction, and a direction intersecting the predetermined plane is referred to as a third direction. The first direction, the second direction, and the third direction may or may not correspond to any one of the X direction, the Y direction, and the Z direction.

Further, in the present specification, expressions such as "upper" and "lower" is based on the substrate. For example, when the first direction intersects the surface of the substrate, a direction away from the substrate along the first direction is referred to as "upper", and a direction approaching the substrate along the first direction is referred to as "lower". In addition, when referring to a lower surface or a lower end of a certain configuration, it means a surface or an end portion on a substrate side of the configuration; and when referring to an upper surface or an upper end, it means a surface or an end portion opposite to the substrate of the configuration. Further, a surface intersecting the second direction or the third direction is referred to as a side surface or the like.

In addition, in the present specification, when a first configuration is "electrically connected" to a second configuration, the first configuration may be directly connected to the second configuration, and the first configuration may be connected to the second configuration via a wire, a semiconductor member, a transistor or the like. For example, when three transistors are connected in series, even if a second transistor is in an OFF state, a first transistor is "electrically connected" to a third transistor.

In addition, in the present specification, when the first configuration is "electrically isolated" from the second configuration, for example, an insulating film or the like is provided between the first configuration and the second configuration, it means a state in which contact, wire or the like for connecting the first configuration and the second configuration is not provided.

In addition, in the present specification, when a circuit or the like "electrically conducts" two wires or the like, for example, the circuit or the like includes a transistor or the like, and the transistor or the like is provided in a current path between the two wires, it means that the transistor or the like is in an ON state.

A circuit configuration of a semiconductor storage device according to at least one embodiment will be described below with reference to the drawings. The following drawings are schematic, and for convenience of description, a part of configuration may be omitted.

First Embodiment

[Schematic Configuration]

Figure 1:
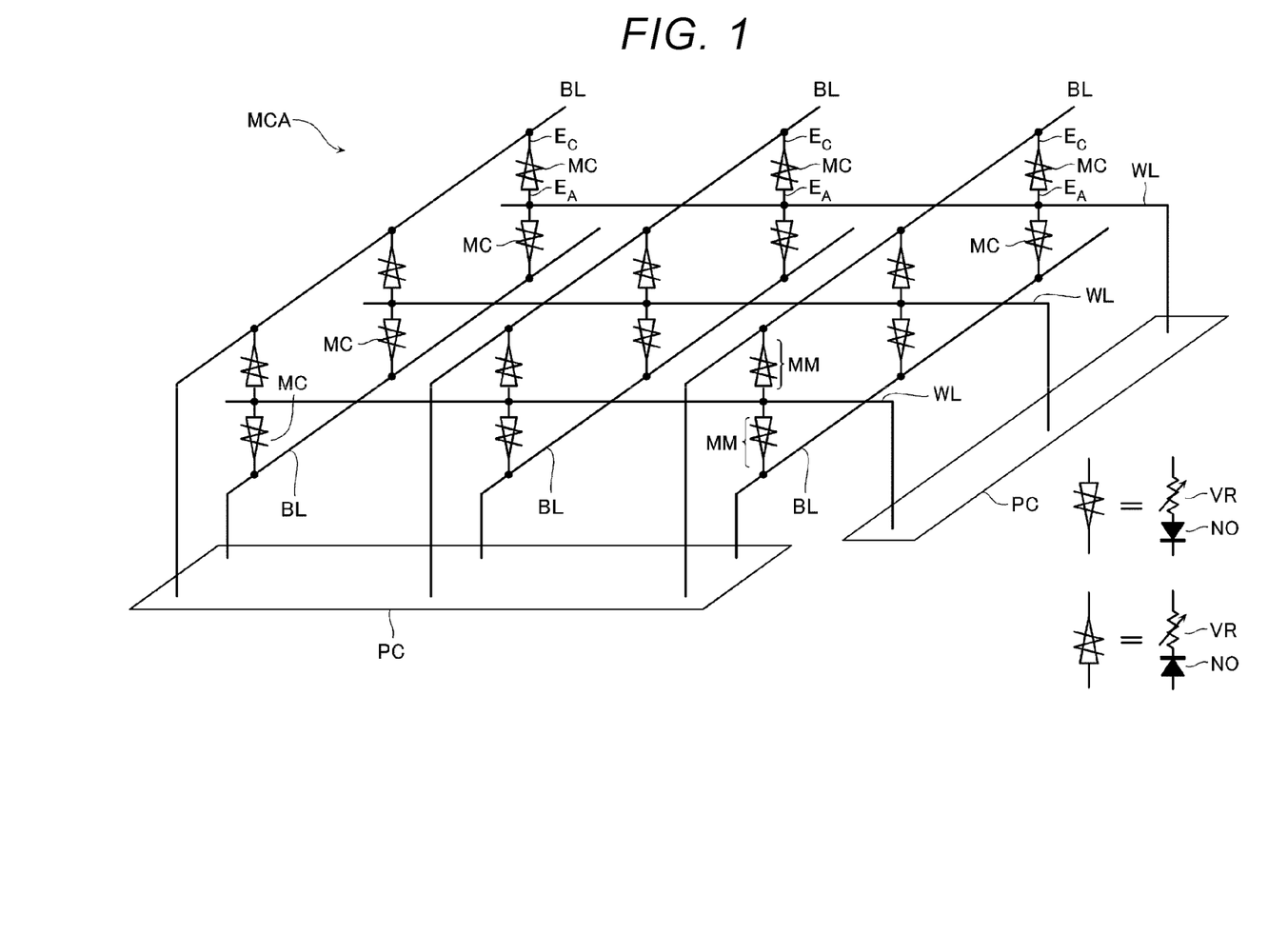
FIG. 1 is a schematic circuit diagram showing a configuration of a part of a semiconductor storage device according to at least one embodiment.
Figure 2:
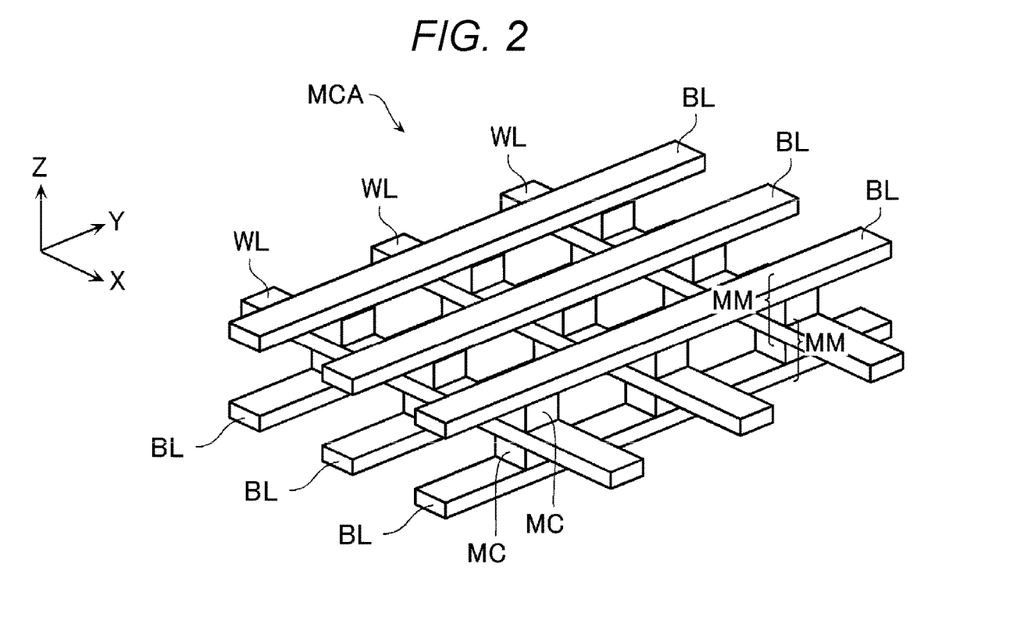
FIG. 2 is a schematic perspective view showing the configuration of the part of the semiconductor storage device.

FIG. 1 is a schematic circuit diagram showing a configuration of a part of the semiconductor storage device according to at least one embodiment. FIG. 2 is a schematic perspective view showing the configuration of the part of the semiconductor storage device.

The semiconductor storage device according to at least one embodiment includes a memory cell array MCA and a peripheral circuit PC that controls the memory cell array MCA.

The memory cell array MCA includes, for example, as shown in FIG. 2, a plurality of memory mats MM aligned in a Z direction. The memory mat MM includes a plurality of bit lines BL arranged in an X direction and extending in a Y direction, a plurality of word lines WL arranged in the Y direction and extending in the X direction, and a plurality of memory cells MC aligned in the X direction and the Y direction corresponding to the bit lines BL and the word lines WL. As shown in the drawing, the bit lines BL or the word lines WL may be commonly provided for two memory mats MM aligned in the Z direction. In the example of FIG. 1, a cathode $E_C$ of a memory cell MC is connected to the bit line BL. Further, an anode $E_A$ of the memory cell MC is connected to the word line WL. The memory cell MC includes a resistance-variable element VR and a nonlinear element NO.

The peripheral circuit PC is connected to the bit line BL and the word line WL. The peripheral circuit PC includes, for example, a booster circuit such as a charge pump circuit that boosts a power supply voltage and outputs the voltage to a voltage supply line, a step-down circuit that steps down the power supply voltage or the like and outputs the voltage to the voltage supply line, a selection circuit that electrically conducts the bit line BL corresponding to a selected address with the voltage supply line corresponding to the word line WL, a sense amplifier circuit that outputs data of 0 or 1 in accordance with a voltage or current of the bit line BL, and a sequencer that controls the above circuits or the like.

[Configuration of Memory Cell MC]

Figure 3A:
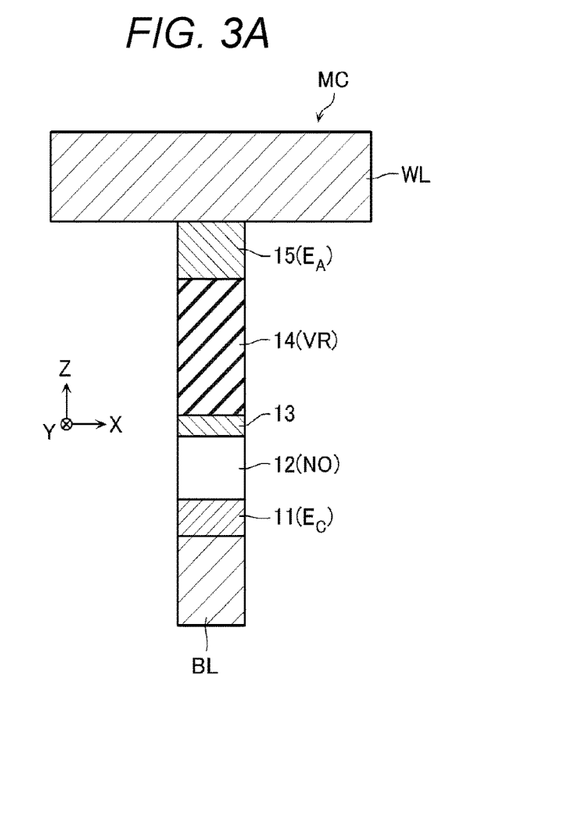
FIG. 3A and FIG. 3B are a schematic cross-sectional view of a memory cell MC.
Figure 3B:
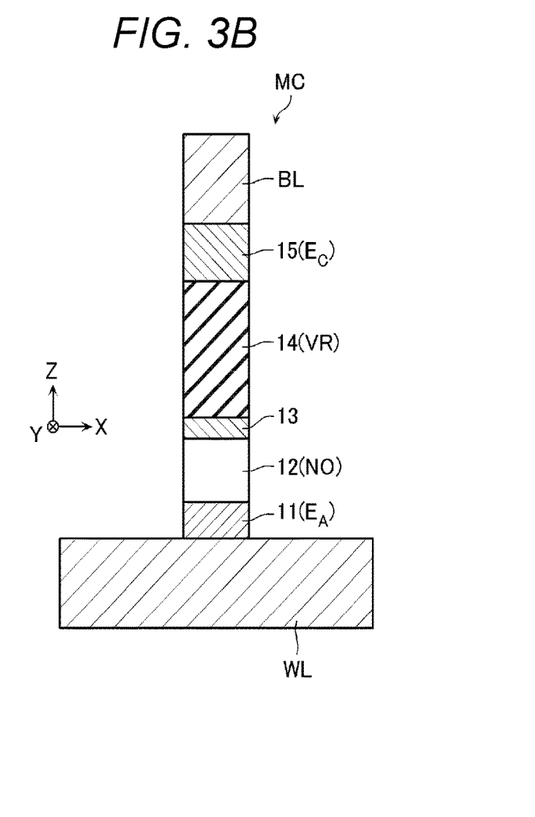
Figure 4A:
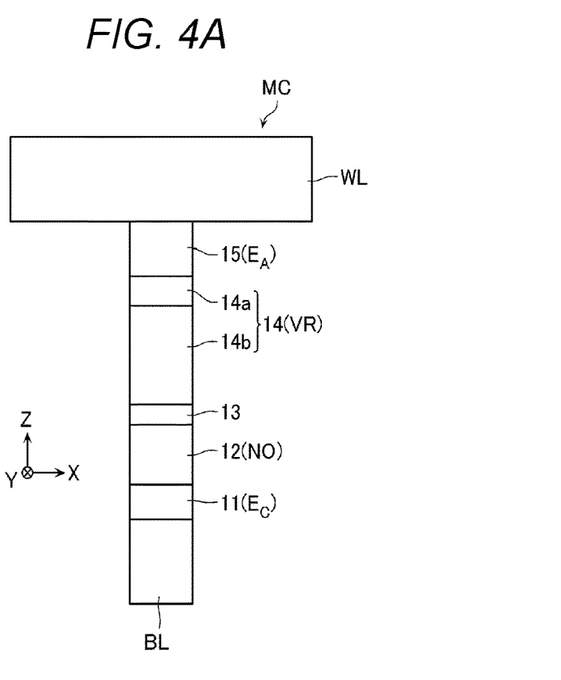
FIG. 4A and FIG. 4B are a schematic cross-sectional view of a memory cell MC.
Figure 4B:
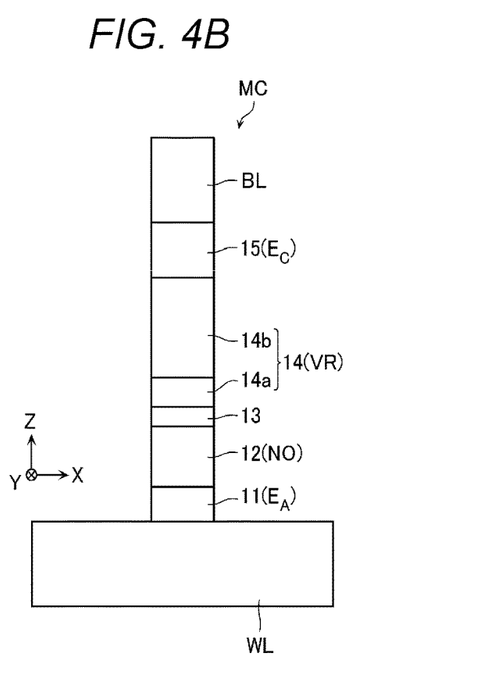

FIG. 3A and FIG. 3B are schematic cross-sectional views of the memory cell MC according to the present embodiment. FIG. 3A corresponds to a configuration in which the bit line BL is provided on a lower side and the word line WL is provided on an upper side. FIG. 3B corresponds to a configuration in which the word line WL is provided on the lower side and the bit line BL is provided on the upper side. FIG. 4A and FIG. 4B are schematic cross-sectional views for illustrating the memory cell MC.

As shown in FIG. 3A and FIG. 3B, the memory cell MC according to at least one embodiment includes a conductive layer 11, a chalcogen layer 12, a conductive layer 13, a chalcogen layer 14, and a conductive layer 15 stacked in the Z direction.

The conductive layer 11 is connected to the bit line BL or the word line WL provided directly below the memory cell MC, and functions as a cathode $E_C$ or an anode $E_A$ of the memory cell MC. The conductive layer 11 may be, for example, a stacked film of titanium nitride (TiN) and tungsten (W), polycrystalline silicon or the like into which an N-type impurity such as phosphorus (P) is implanted, and other conductive layers made of carbon (C), carbon nitride (CN), tungsten carbide (WC), tungsten carbonitride (WCN), tungsten carbide nitride silicide (WCNSi) or the like.

The chalcogen layer 12 functions as a nonlinear element NO. For example, when a voltage lower than a predetermined threshold voltage is applied to the chalcogen layer 12, the chalcogen layer 12 is in a high resistance state. When the voltage applied to the chalcogen layer 12 reaches the predetermined threshold voltage, the chalcogen layer 12 is in a low resistance state, and a current flowing through the chalcogen layer 12 increases by a plurality of orders of magnitude. When the voltage applied to the chalcogen layer 12 falls below the predetermined voltage, the chalcogen layer 12 is in the high resistance state again.

The chalcogen layer 12 contains, for example, at least one kind of chalcogen. The chalcogen layer 12 may contain, for example, a chalcogenide which is a compound containing chalcogen. Further, the chalcogen layer 12 may contain at least one kind of element selected from a group consisting of B, Al, Ga, In, C, Si, Ge, Sn, As, P, and Sb.

The term "chalcogen" used herein excludes oxygen (O) among the elements belonging to the sixteenth group in the periodic table. The chalcogen contains, for example, sulfur (S), selenium (Se), tellurium (Te) or the like.

The conductive layer 13 functions as an electrode that connects the nonlinear element NO and the resistance-variable element VR. The conductive layer 13 may include, for example, the same material as the conductive layer 11.

The chalcogen layer 14 functions as the resistance-variable element VR. The chalcogen layer 14 includes, for example, as shown in FIG. 4A and FIG. 4B, a crystalline region 14a and a phase change region 14b. The crystalline region 14a is provided on an anode side of the phase change region 14b. The phase change region 14b is in an amorphous state (reset state: high resistance state) by heating to a melting temperature or higher and rapid cooling. In addition, the phase change region 14b is in a crystalline state (set state: low resistance state) by heating to a temperature lower than a melting temperature and higher than a crystallization temperature and gentle cooling. The ratio of the phase change region 14b in width of the Z direction of the chalcogen layer 14 may be larger than the ratio of the crystalline region 14a.

The chalcogen layer 14 contains, for example, at least one kind of chalcogen. The chalcogen layer 14 may contain, for example, a chalcogenide which is a compound containing the chalcogen. The chalcogen layer 14 may be, for example, GeSbTe, GeTe, SbTe, SiTe. Further, the chalcogen layer 14 may contain at least one kind of element selected from germanium (Ge), antimony (Sb), and tellurium (Te). Hereinafter, an example in which the chalcogen layer 14 contains GeSbTe will be described.

The conductive layer 15 is connected to the word line WL or the bit line BL provided directly above the memory cell MC, and functions as an anode $E_A$ or a cathode $E_C$ of the memory cell MC. The conductive layer 15 may contain, for example, the same material as the conductive layer 11.

[Electrical Characteristics of Memory Cell MC]

Figure 5:
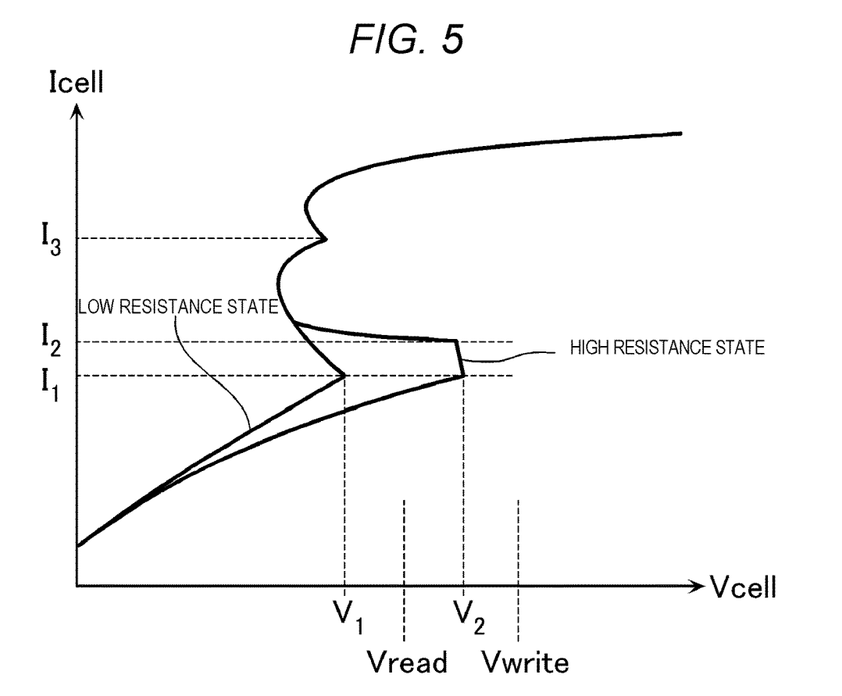
FIG. 5 is a schematic graph showing current-voltage characteristics of the memory cell MC.

FIG. 5 is a schematic graph showing current-voltage characteristics of the memory cell MC according to at least one embodiment. A horizontal axis shows a cell voltage Vcell, which is a voltage difference between the cathode $E_C$ and the anode $E_A$ of the memory cell MC. A vertical axis shows a cell current Icell flowing to the memory cell MC in a logarithmic axis.

In a range where the cell current Icell is smaller than a predetermined current value $I_1$, the cell voltage Vcell increases monotonously in accordance with the increase in the cell current Icell. When the cell current Icell reaches the current value $I_1$, the cell voltage Vcell of the memory cell MC in the low resistance state reaches a voltage $V_1$. Further, the cell voltage Vcell of the memory cell MC in the high resistance state reaches a voltage $V_2$. The voltage $V_2$ is larger than the voltage $V_1$.

In a range where the cell current Icell is larger than the current value $I_1$ and smaller than a current value $I_2$, the cell voltage Vcell decreases monotonously in accordance with the increase in the cell current Icell. In the range, the cell voltage Vcell of the memory cell in the high resistance state is larger than the cell voltage Vcell of the memory cell MC in the low resistance state.

In a range where the cell current Icell is larger than the current value $I_2$ and smaller than a current value $I_3$, the cell voltage Vcell temporarily decreases and then increases in accordance with the increase of the cell current Icell. In the range, the cell voltage Vcell of the memory cell MC in the high resistance state abruptly decreases in accordance with the increase in the cell current Icell, and becomes approximately the same as the cell voltage Vcell of the memory cell MC in the low resistance state.

In a range where the cell current Icell is larger than the current value $I_3$, the cell voltage Vcell temporarily decreases and then increases in accordance with the increase of the cell current Icell.

In this state, when the cell current Icell is rapidly decreased to a magnitude smaller than the current $I_1$, the chalcogen layer 14 is brought into a high resistance state. In addition, when the cell current Icell is decreased to a predetermined magnitude, the state is maintained for a certain period of time, and then the cell current Icell is decreased to a magnitude smaller than the current $I_1$, the chalcogen layer 14 is brought into a low resistance state.

[Operation]

In a write operation, for example, first, the cell voltage Vcell is adjusted to a write voltage Vwrite larger than the voltage $V_2$. Next, when the memory cell MC is desired to be in the high resistance state, for example, the cell voltage Vcell is decreased to 0 V within a predetermined time. On the other hand, when the memory cell MC is desired to be in the low resistance state, for example, the cell voltage Vcell is decreased to a predetermined voltage and is held for a certain period, and thereafter, the cell voltage Vcell is set to 0 V.

In a read operation, for example, the cell voltage Vcell is set to a read voltage Vread which is higher than the voltage $V_1$ and smaller than the voltage $V_2$, and whether or not the cell current Icell in this state is larger than a threshold voltage is detected. The threshold voltage may be, for example, the current value $I_1$ or higher.

[Miniaturization of Memory Cell MC]

When the semiconductor storage device is highly integrated, it is desirable that the width of the memory cell MC (FIG. 3A and FIG. 3B) in the Z direction is small. For this reason, it is desirable that the width of the chalcogen layer 14 in the Z direction is also smaller.

However, if the width of the chalcogen layer 14 in the Z direction is reduced, a difference between the voltage $V_1$ and the voltage $V_2$ in FIG. 5 may be reduced. This is due to that the difference between the voltage $V_1$ and the voltage $V_2$ is affected by the width of the phase change region 14b (FIG. 4A and FIG. 4B) of the chalcogen layer 14 in the Z direction. When considering a variation in the electrical characteristics of each memory cell MC, it is desirable that the difference between the voltage $V_1$ and the voltage $V_2$ has a magnitude of a predetermined value or higher.

Here, when energization to the memory cell MC is repeated, tellurium (Te) contained in the memory cell MC may move to the anode $E_A$ side (word line WL side) of the memory cell MC, and germanium (Ge) and antimony (Sb) may move to the cathode $E_C$ side (bit line BL side) of the memory cell MC. When such movement of the elements occurs, distribution of the composition ratios in the chalcogen layer 14 may be biased, and the ratio of the phase change region 14b in the width of the chalcogen layer 14 in the Z direction may be reduced.

Figure 6:
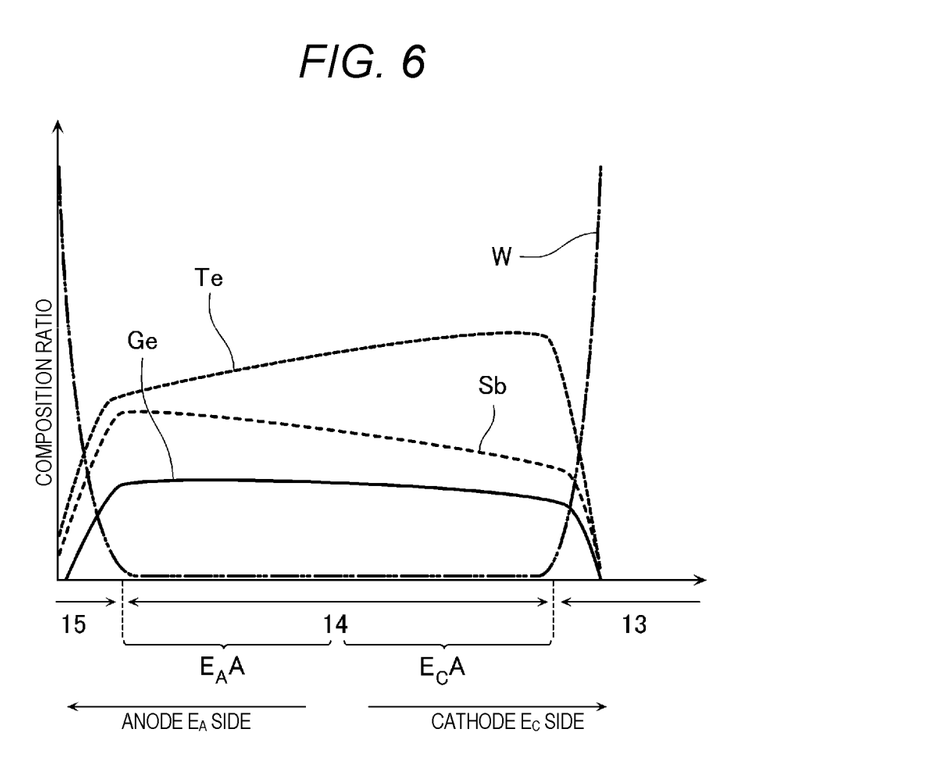
FIG. 6 is a graph showing composition ratios of elements in a chalcogen layer.

Therefore, in at least one embodiment, for example, as illustrated in FIG. 6, film-formation of the chalcogen layer 14 is performed so that the composition ratio of germanium (Ge) and antimony (Sb) decreases from the anode $E_A$ side to the cathode $E_C$ side, and the composition ratio of tellurium (Te) increases from the anode $E_A$ side to the cathode $E_C$ side. For example, when the film-formation of the chalcogen layer 14 is performed by a method such as Physical Vapor Deposition (PVD) including sputtering, a target of a different composition containing germanium, antimony, and tellurium may be used. Further, co-sputtering may be performed to adjust a rate of each material. Further, for example, when the film-formation of the chalcogen layer 14 is performed by a method such as Chemical Vapor Deposition (CVD), the film-formation may be performed while increasing or decreasing a flow rate of gas corresponding to each element.

Figure 7:
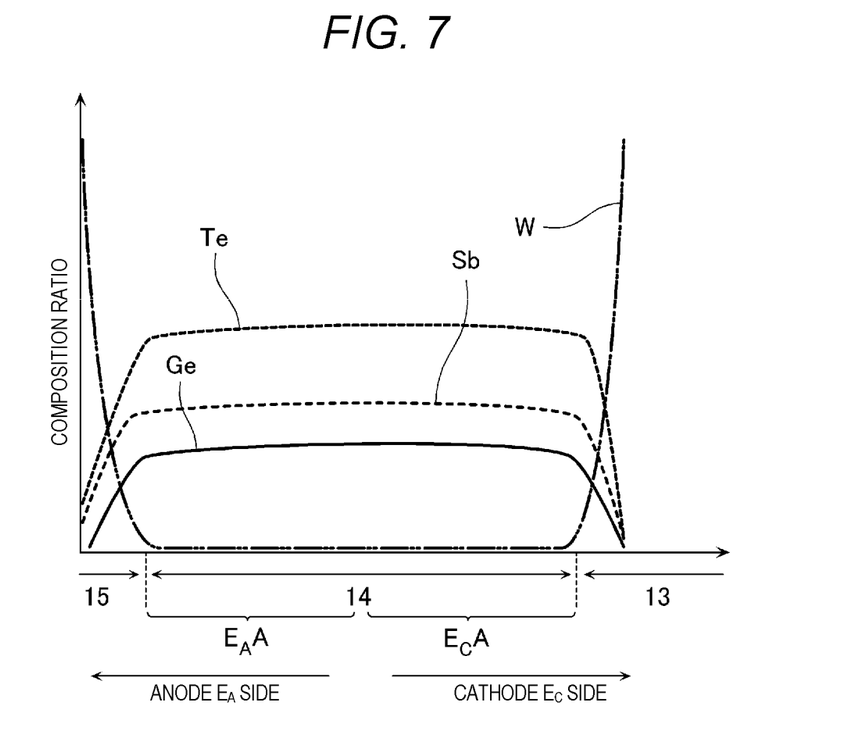
FIG. 7 is a graph showing composition ratios of elements in a chalcogen layer.

In the chalcogen layer 14 film-formed in such a manner, when the movement of the elements as described above occurs while repeating the energization, for example, as illustrated in FIG. 7, in the entire chalcogen layer 14, the composition ratios of germanium (Ge), antimony (Sb), and tellurium (Te) approach a uniform state. Therefore, the ratio of the phase change region 14b in the chalcogen layer 14 can be increased. As a result, it is possible to reduce the width of the chalcogen layer 14 in the Z direction while preventing a decrease in the difference between the voltage $V_1$ and the voltage $V_2$.

As described above, in the example of FIG. 6, the composition ratio of each material in the chalcogen layer 14 increases or decreases from the anode $E_A$ side to the cathode $E_C$ side. For example, a maximum value of the composition ratio of germanium, a maximum value of the composition ratio of antimony, and a minimum value of the composition ratio of tellurium may be provided in a region (hereafter referred to as "anode side region $E_AA$") closer to the anode $E_A$ side than a center position in the Z direction of the chalcogen layer 14. Further, a minimum value of the composition ratio of germanium, a minimum value of the composition ratio of antimony, and a maximum value of the composition ratio of tellurium may be provided in a region (hereinafter referred to as "cathode side region $E_CA$") closer to the cathode $E_C$ side than the center position in the z direction of the chalcogen layer 14. Further, for example, an average value of the composition ratios of germanium in the anode side region $E_AA$ may be larger than an average value of the composition ratio of germanium in the cathode side region $E_CA$. The same applies to antimony. For tellurium, an average value of the composition ratios in the anode side region $E_AA$ may be smaller than an average value of the composition ratios in the cathode side region $E_CA$.

Further, as described above, in the example of FIG. 7, the composition ratio of each material in the chalcogen layer 14 approaches a uniform state as compared with that in the example of FIG. 6. For example, the minimum values of the composition ratios of germanium, antimony and tellurium (hereinafter referred to as "each material") illustrated in FIG. 7 may respectively be larger than the minimum value of each material illustrated in FIG. 6. Further, the maximum value of the composition ratio of each material illustrated in FIG. 7 may be smaller than the corresponding maximum value of the composition ratio of each material illustrated in FIG. 6. Further, a difference between the minimum value and the maximum value of each material illustrated in FIG. 7 may be smaller than a corresponding difference between the minimum value and the maximum value of the composition ratio of each material illustrated in FIG. 6. Further, for example, a difference between an average value in the anode side region $E_AA$ and an average value in the cathode side region $E_CA$ of the composition ratio of each material in the example of FIG. 7 may be smaller than a difference between an average value in the anode side region $E_AA$ and an average value in the cathode side region $E_CA$ of the composition ratio of each material in the example of FIG. 6.

The composition ratio of each material in the chalcogen layer 14 can be observed by, for example, a method such as Energy Dispersive X-ray Spectrometry (EDS). In addition, it is also possible to perform setting of an approximation line by a least squares method or the like and movement average processing or the like on the composition ratios obtained by the method such as EDS, so as to determine the composition ratios based on the result.

Configuration Example of Semiconductor Storage Device

Figure 8:
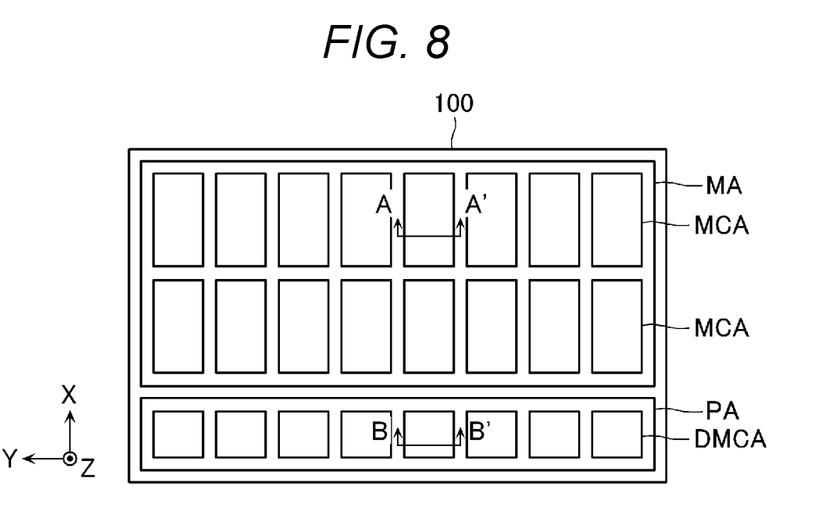
FIG. 8 is a schematic plan view showing a configuration example of the semiconductor storage device according to at least one embodiment.
Figure 9:
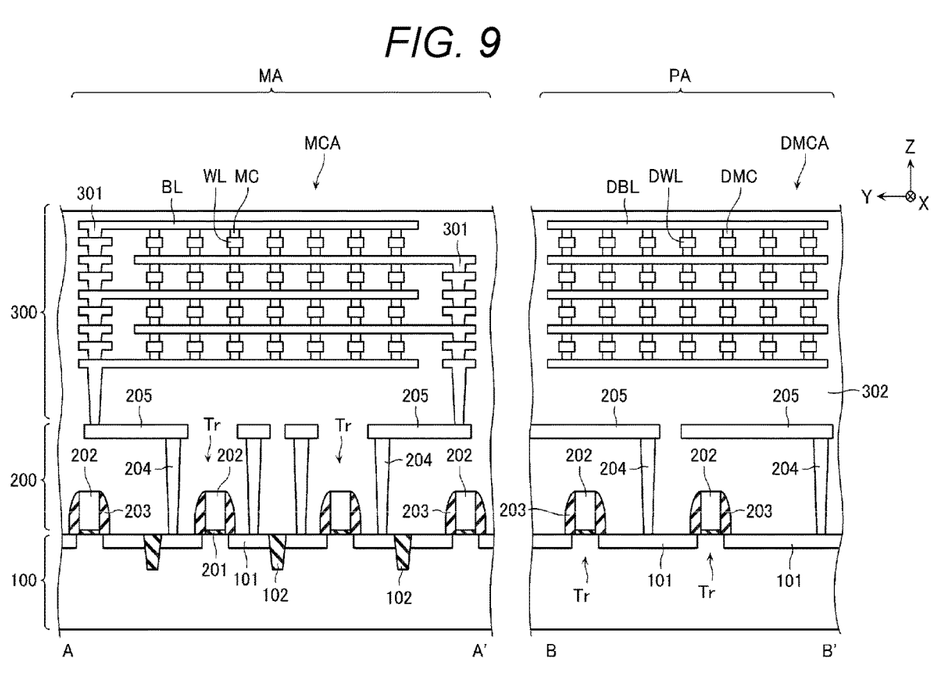
FIG. 9 is a schematic cross-sectional view showing the configuration example.

As described above, the chalcogen layer 14 in the memory cell MC according to at least one embodiment has the distribution of the composition ratios as described with reference to FIG. 7. However, the semiconductor storage device according to the present embodiment may include a chalcogen layer having the distribution of the composition ratios as described with reference to FIG. 6. Hereinafter, such an example will be described with reference to FIGS. 8 and 9. FIG. 8 is a schematic plan view showing a configuration example of the semiconductor storage device according to at least one embodiment. FIG. 9 is a schematic cross-sectional view of the configuration shown in FIG. 8 taken along a line A-A' and a line B-B', and viewed in the direction of the arrow.

As shown in FIG. 8, the semiconductor storage device according to at least one embodiment is provided on, for example, a substrate 100. A memory region MA and a peripheral region PA are provided on the substrate 100. The memory region MA includes a plurality of memory cell arrays MCA aligned in the X direction and the Y direction. The peripheral region PA includes at least one dummy memory cell array DMCA.

As shown in FIG. 9, the semiconductor storage device according to at least one embodiment includes, for example, the substrate 100, a transistor layer 200 provided on the upper side of the substrate 100, and a memory layer 300 provided on the upper side of the transistor layer 200. An insulating film 302 such as silicon oxide ($SiO_2$) is embedded between the transistor layer 200 and the memory layer 300.

The substrate 100 is, for example, a semiconductor substrate such as silicon (Si) containing a P-type impurity. A plurality of diffusion layers 101 containing the N-type impurity and a plurality of STIs 102 that divides the diffusion layers 101 are provided on the upper surface of the substrate 100.

The transistor layer 200 includes a plurality of transistors Tr that form each configuration in the peripheral circuit PC illustrated in FIG. 1 or the like. The transistor layer 200 includes, for example, a gate insulating film 201 provided on the upper surface of the substrate 100, a gate electrode 202 provided on an upper surface of the gate insulating film 201, and an insulating layer 203 provided on a side surface of the gate electrode 202. Further, the diffusion layer 101 of the substrate 100 and the gate electrode 202 are connected to a wire 205 via a contact plug 204. The wire 205 is provided on the upper side of the gate electrode 202.

The memory layer 300 includes, for example, the memory cell array MCA and the dummy memory cell array DMCA.

The memory cell array MCA has, for example, a configuration as described with reference to FIGS. 1 to 3. However, the memory cell array MCA illustrated in FIG. 9 includes eight memory mats MM aligned in the Z direction. The bit line BL and the word line WL in the memory cell array MCA are connected to the transistor Tr constituting the peripheral circuit PC via the contact 301 or the like. Further, the distribution of the composition ratios of the materials in the chalcogen layer 14 in the memory cell MC is relatively uniform as illustrated in FIG. 7.

The dummy memory cell array DMCA is configured to be formed simultaneously with memory cell array MCA, for convenience of the manufacturing process or the like, and has the same film configuration as the memory cell array MCA. That is, the dummy memory cell array DMCA illustrated in FIG. 9 includes a plurality of dummy word lines DWL provided in the same wiring layer as the plurality of word lines WL, a plurality of dummy bit line layers DBL provided in the same wiring layer as the plurality of bit lines BL, and a plurality of dummy memory cells DMC provided in the same layer as the plurality of memory cells MC. Further, the materials or the like provided in each layer constituting the dummy memory cell array DMCA are the same as those provided in each layer constituting the memory cell array MCA.

In addition, for example, the dummy memory cell DMC includes the conductive layer 11, the chalcogen layer 12, the conductive layer 13, the chalcogen layer 14, and the conductive layer 15 as described with reference to FIG. 3A and FIG. 3B, which is the same as the memory cell MC. The material, film thickness or the like of each layer are substantially the same as the material and film thickness of each layer in the memory cell MC. However, the entire chalcogen layer 14 in the dummy memory cell DMC is a crystalline region, and does not include an amorphous region (phase change region). Further, the composition ratio of each material in the chalcogen layer 14 of the dummy memory cell DMC has a distribution as described with reference to FIG. 6. That is, in the chalcogen layer 14 of the dummy memory cell DMC, the composition ratios of germanium (Ge) and antimony (Sb) decreases from the dummy word line DWL side to the dummy bit line layer DBL side. Further, in the chalcogen layer 14 of the dummy memory cell DMC, the composition ratio of tellurium (Te) increases from the dummy word line DWL side to the dummy bit line layer DBL side.

In addition, the dummy memory cell array DMCA is not used for data storage or the like. Therefore, the configuration of the dummy memory cell array DMCA (the dummy word line DWL, the dummy bit line DBL or the like) may not be connected to the transistor Tr constituting the peripheral circuit PC. Further, the contact 301 or the like may not be connected to the configuration of the dummy memory cell array DMCA. Further, a plurality of adjacent dummy bit lines DBL or dummy word lines DWL may be connected to each other, and a wiring pitch, a wiring width or the like may be different from those of the memory cell array MCA.

Other Embodiments

The chalcogen layer 14 in the dummy memory cell DMC is illustrated as the chalcogen layer in which the distribution of the composition ratio as described with reference to FIG. 6 is observed. However, reasons of the composition ratio of each material in the chalcogen layer 14 of the dummy memory cell DMC having the distribution as described with reference to FIG. 6 are that the chalcogen layer 14 in the memory cell MC and the chalcogen layer 14 in the dummy memory cell DMC are simultaneously film-formed, and the dummy memory cell DMC is not energized while the memory cell MC is energized. Therefore, when such a chalcogen layer exists in addition to the dummy memory cell DMC, the composition ratio of each material in the chalcogen layer may also have a distribution as described with reference to FIG. 6. Such a chalcogen layer may be provided, for example, at an end portion of the memory cell array MCA in the X direction and the Y direction. Further, for example, when a part of the bit line BL or the word line WL in the memory cell array MCA is disconnected, the chalcogen layer may be contained in the memory cell array MCA.

Further, in the first embodiment, an example in which the chalcogen layer 14 contains GeSbTe was described. However, as described above, the material of the chalcogen layer 14 may be appropriately changed. Even in such a case, when the chalcogen layer 14 contains at least one of germanium (Ge), antimony (Sb), and tellurium (Te), the film-formation of the chalcogen layer 14 may be performed so that the composition ratio of at least one of germanium (Ge) and antimony (Sb) decreases from the anode $E_A$ side to the cathode $E_C$ side, or the composition ratio of tellurium (Te) increases from the anode $E_A$ side to the cathode $E_C$ side.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a first conductive layer, a second conductive layer separated from the first conductive layer in a first direction, and a first chalcogen layer provided between the first conductive layer and the second conductive layer;
   a third conductive layer, a fourth conductive layer separated from the third conductive layer in the first direction, and a second chalcogen layer provided between the third conductive layer and the fourth conductive layer; and
   a peripheral circuit connected to the first conductive layer and the second conductive layer, wherein
   the third conductive layer and the fourth conductive layer are not connected to the peripheral circuit,
   the second chalcogen layer contains tellurium (Te), and
   when a minimum value and a maximum value of a composition ratio of tellurium in the second chalcogen layer observed along the first direction are a first minimum value and a first maximum value, respectively,
      the first minimum value is observed at a position closer to the third conductive layer than a center position in the first direction of the second chalcogen layer, and
      the first maximum value is observed at a position closer to the fourth conductive layer than the center position in the first direction of the second chalcogen layer.

2. The semiconductor storage device according to claim 1, wherein
   the first chalcogen layer contains tellurium, and
   when a minimum value and a maximum value of a composition ratio of tellurium in the first chalcogen layer observed along the first direction are a second minimum value and a second maximum value, respectively,
   a difference between the second maximum value and the second minimum value is smaller than a difference between the first maximum value and the first minimum value.

3. The semiconductor storage device according to claim 2, wherein
   the first chalcogen layer and the second chalcogen layer each contain germanium (Ge), antimony (Sb), and tellurium (Te).

4. The semiconductor storage device according to claim 2, wherein
   the first conductive layer and the third conductive layer are provided in a same wiring layer,
   the second conductive layer and the fourth conductive layer are provided in a same wiring layer, and
   in at least one of a write operation or a read operation, a voltage of the first conductive layer is greater than a voltage of the second conductive layer.

5. The semiconductor storage device according to claim 2, wherein
   the first conductive layer and the third conductive layer are provided in a same wiring layer, the second conductive layer and the fourth conductive layer are provided in a same wiring layer, and the first chalcogen layer includes an amorphous region provided between the first conductive layer and the second conductive layer, and a crystalline region provided between the amorphous region and the second conductive layer.

6. The semiconductor storage device according to claim 1, wherein the first chalcogen layer and the second chalcogen layer each contain germanium (Ge), antimony (Sb), and tellurium (Te).

7. The semiconductor storage device according to claim 6, wherein the first conductive layer and the third conductive layer are provided in a same wiring layer, the second conductive layer and the fourth conductive layer are provided in a same wiring layer, and in at least one of a write operation or a read operation, a voltage of the first conductive layer is greater than a voltage of the second conductive layer.

8. The semiconductor storage device according to claim 6, wherein the first conductive layer and the third conductive layer are provided in a same wiring layer, the second conductive layer and the fourth conductive layer are provided in a same wiring layer, and the first chalcogen layer includes an amorphous region provided between the first conductive layer and the second conductive layer, and a crystalline region provided between the amorphous region and the second conductive layer.

9. The semiconductor storage device according to claim 1, wherein the first conductive layer and the third conductive layer are provided in a same wiring layer, the second conductive layer and the fourth conductive layer are provided in a same wiring layer, and in at least one of a write operation or a read operation, a voltage of the first conductive layer is greater than a voltage of the second conductive layer.

10. The semiconductor storage device according to claim 1, wherein the first conductive layer and the third conductive layer are provided in a same wiring layer, the second conductive layer and the fourth conductive layer are provided in a same wiring layer, and the first chalcogen layer includes an amorphous region provided between the first conductive layer and the second conductive layer, and a crystalline region provided between the amorphous region and the second conductive layer.

11. The semiconductor storage device according to claim 1, wherein the first chalcogen layer is a resistance-variable element.

12. A semiconductor storage device, comprising:

a first conductive layer, a second conductive layer separated from the first conductive layer in a first direction, and a first chalcogen layer provided between the first conductive layer and the second conductive layer;

a third conductive layer, a fourth conductive layer separated from the third conductive layer in the first direction, and a second chalcogen layer provided between the third conductive layer and the fourth conductive layer; and a peripheral circuit connected to the first conductive layer and the second conductive layer, wherein the third conductive layer and the fourth conductive layer are not connected to the peripheral circuit, the second chalcogen layer contains antimony (Sb), and when a minimum value and a maximum value of a composition ratio of antimony in the second chalcogen layer observed along the first direction are a third minimum value and a third maximum value, respectively, the third minimum value is observed at a position closer to the fourth conductive layer than a center position in the first direction of the second chalcogen layer, and the third maximum value is observed at a position closer to the third conductive layer than the center position in the first direction of the second chalcogen layer.

13. The semiconductor storage device according to claim 12, wherein the first chalcogen layer contains antimony, and when a minimum value and a maximum value of a composition ratio of antimony in the first chalcogen layer observed along the first direction are a fourth minimum value and a fourth maximum value, respectively, a difference between the fourth maximum value and the fourth minimum value is smaller than a difference between the third maximum value and the third minimum value.

14. The semiconductor storage device according to claim 13, wherein the first chalcogen layer and the second chalcogen layer each contain germanium (Ge), antimony (Sb), and tellurium (Te).

15. The semiconductor storage device according to claim 13, wherein the first conductive layer and the third conductive layer are provided in a same wiring layer, the second conductive layer and the fourth conductive layer are provided in a same wiring layer, and in at least one of a write operation or a read operation, a voltage of the first conductive layer is greater than a voltage of the second conductive layer.

16. The semiconductor storage device according to claim 13, wherein the first conductive layer and the third conductive layer are provided in a same wiring layer, the second conductive layer and the fourth conductive layer are provided in a same wiring layer, and the first chalcogen layer includes an amorphous region provided between the first conductive layer and the second conductive layer, and a crystalline region provided between the amorphous region and the second conductive layer.

17. The semiconductor storage device according to claim 12, wherein the first chalcogen layer and the second chalcogen layer each contain germanium (Ge), antimony (Sb), and tellurium (Te).

18. The semiconductor storage device according to claim 12, wherein the first conductive layer and the third conductive layer are provided in a same wiring layer, the second conductive layer and the fourth conductive layer are provided in a same wiring layer, and in at least one of a write operation or a read operation, a voltage of the first conductive layer is greater than a voltage of the second conductive layer.

19. The semiconductor storage device according to claim 12, wherein
the first conductive layer and the third conductive layer are provided in a same wiring layer,
the second conductive layer and the fourth conductive layer are provided in a same wiring layer, and
the first chalcogen layer includes an amorphous region provided between the first conductive layer and the second conductive layer, and a crystalline region provided between the amorphous region and the second conductive layer.

* * * * *